United States Patent [19]
Horn

[11] Patent Number: 4,498,044
[45] Date of Patent: Feb. 5, 1985

[54] METHOD AND CIRCUITRY FOR MEASURING THE IMPEDANCE OF A SENSOR

[75] Inventor: Petr Horn, Oberhasli, Switzerland

[73] Assignee: Novasina AG, Zurich, Switzerland

[21] Appl. No.: 377,070

[22] Filed: May 11, 1982

[30] Foreign Application Priority Data

May 18, 1981 [CH] Switzerland .......................... 3218/81

[51] Int. Cl.[3] .............................................. G01R 27/02
[52] U.S. Cl. ................................ 324/65 R; 324/57 R; 324/436; 324/442
[58] Field of Search ...................... 324/65 R, 57 R, 62, 324/436, 442

[56] References Cited

U.S. PATENT DOCUMENTS 4,160,205 7/1979 Hobbs et al. ...................... 324/65 R

*Primary Examiner*—Stanley T. Krawczewicz
*Attorney, Agent, or Firm*—Charles E. Brown

[57] ABSTRACT

A method of measuring the impedance of a sensor by applying a sine-shaped AC voltage and transforming the response signal proportional to said impedance into a DC voltage such that even for very little measured voltage highest linearity is present. The method comprises the steps of generating a square wave voltage together and in synchronism with said AC voltage, applying said AC voltage to said sensor impedance, filtering the resulting AC voltage and bringing it into a defined phase relation to the square wave and rectifying the AC voltage by means of a switch controlled by said square wave. The rectifier circuit is a low-pass circuit having a grounded resistor which by said switch intermittedly is short-circuited.

8 Claims, 7 Drawing Figures oscillator
1'
2'
Zx
3'
TP
5
Ph S
phase adjustment
PRIOR ART oscillator
1
2
Zx
4
filter
3
TP

R

R

METHOD AND CIRCUITRY FOR MEASURING THE IMPEDANCE OF A SENSOR

BACKGROUND OF THE INVENTION

1. Field of the Invention

The present invention relates to a new and improved method of measuring the impedance of a sensor by applying a sine-shaped AC voltage of defined frequency and to a circuitry for carrying out this method. This type of impedance measurement is especially important for pure AC - measurements as is necessary e.g. to determine the resistance of electrolytic solutions.

2. Description of the Prior Art

A conventional method of measuring impedances by a sine-shaped AC voltage is disclosed in H. Helke's "Messbrücken und Kompensatoren für Wechselstrom", R. Oldenburg Verlag, 1971, p. 243, and is based on a lock-in amplifier for variable frequency. A prior art circuitry of this type is shown in annexed FIG. 1. The sine-shaped AC voltage is applied to a measuring circuit containing the impedance $Z_x$ to be measured, the output of which then is supplied to a rectifier circuit controlled by a square wave AC voltage. In order to adjust the phases of said two AC voltages, which is a necessary condition for the proper function of the circuitry, the phase of the square wave AC voltage is shifted.

Another possibility for adjusting said phases which has been developed by the inventor of the present invention in order to avoid said phase shifting consists in using a filter circuit connected at the output of the measuring circuit containing the impedance $Z_x$ as shown in FIG. 2 which replaces the above phase shift. By appropriate construction of the filter circuit only the AC voltage proportional to the impedance to be measured is phaseshifted at its output (but not all other interfering frequencies) such that it is in phase with the square wave AC voltage. The present invention refers to this type of measuring circuit.

A circuit known from Electronics & Power, Vol. 23, No. 5, May 1977, p. 387, also uses a filter circuit connected to the measuring circuit containing the impedance. This filter circuit, however, is used to separate the measured signal from the interfering frequencies and not to establish a given phase relationship between the sine- and square waves.

In the publication FR-A-2 049 584 a circuitry is disclosed which is used as a rectifier or a modulator. In this circuit a resistor is grounded by means of a square wave, but this circuit does not incorporate any low-pass circuit.

In all the above circuitries, however, there is the problem of linearity when measuring extremely low impedances, the measured voltages being in the range of millivolts.

SUMMARY OF THE INVENTION

Hence, it is a general object of the present invention to provide an improved method and circuitry for measuring impedances by means of an AC voltage.

Another object of the invention aims at the provision of a measuring method and a circuitry having high linearity even for little measured voltages which enables a more precise measuring of little impedances.

Still a further object of the invention is to provide a simplified method and circuitry using one predetermined measuring frequency and avoid expensive circuits for controlled phase shift without, however, affecting the measuring quality.

Now, in order to implement these and still further objects of the invention, which will become more readily apparent as the description proceeds, the method of the invention comprises the steps of generating a square wave voltage in synchronism with the sine-shaped AC voltage;

applying the sine-shaped AC voltage to a measuring circuit containing said impedance;

modifying the resulting AC voltage proportional to said impedance in a selective circuit of a defined phase-frequency- and amplitude-frequency characteristic, thereby bringing said AC voltage into a defined phase relation to said square wave voltage; and rectifying the modified AC voltage and transforming it into a DC voltage proportional to said impedance in a rectifier- and low-pass circuit, said rectifying and transforming step being affected by intermittedly short-circuiting a grounded resistor of said rectifier- and low-pass circuit by means of a switch controlled by said square wave voltage.

The circuitry for carrying out the above method comprises an oscillator circuit for generating a sine-shaped AC voltage and a square wave voltage in synchronism, a measuring circuit connected to the oscillator circuit and containing an impedance to be measured, a rectifier- and low-pass circuit, and a filter circuit connected between said rectifier- and low-pass circuit and said measuring circuit, said rectifier- and low-pass circuit being a low-pass circuit having a grounded resistor and a switch controlled by said square wave voltage for short-circuiting said grounded resistor.

BRIEF DESCRIPTION OF THE DRAWINGS

The present invention will be more fully understood by reference to the following detailed description thereof, when read in conjunction with the attached drawings, wherein.

Figure 1:
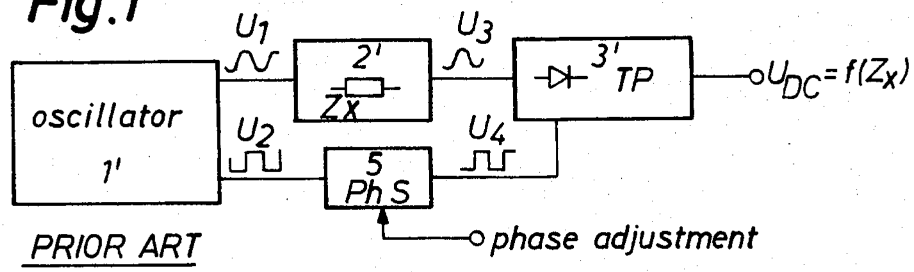
FIG. 1 is a block diagram of a prior art lock-in amplifier.

First, in FIG. 1 a prior art lock-in amplifier used for measuring an impedance $Z_x$ is shown. In an oscillator circuit 1' a sine-shaped AC voltage U1 and a square wave AC voltage U2 having the same frequency are generated. The sine-shaped voltage is supplied to a measuring circuit containing the impedance $Z_x$ to be measured. The measuring circuit 2' may consist in a bridge circuit and an amplifier and has at its output a sine-shaped AC voltage signal U3 proportional to the impedance $Z_x$. This AC voltage signal U3 is applied to a rectifier- and low-pass circuit 3'. Often the rectifier stage of this circuit 3' is called mixing or demodulator stage. The rectifier stage is also supplied by a square wave AC voltage U4 generated in a controlled phase shifter 5 from the square wave signal U2.

A necessary condition for the proper function of the prior art lock-in amplifier is equal phase of the voltage signals U3 and U4. This is accomplished by controlled phase shifting in a phase shifter 5. If the lock-in amplifier is operated with a fixed frequency, the phase control can be replaced by a simple phase adjustment.

Figure 2:
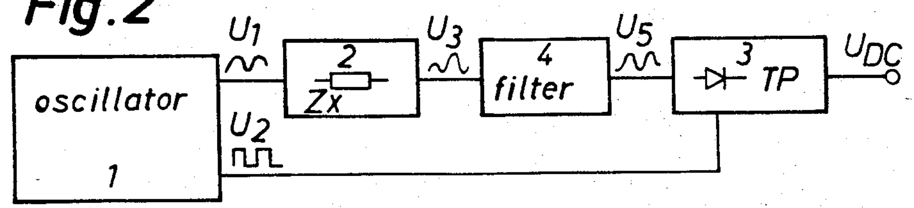
FIG. 2 is a block diagram of a circuit without controlled phase shift as developed by the inventor.

In FIG. 2 a block diagram of a measuring circuit without phase control is shown. The phase shifter of FIG. 1 is replaced in its function by a filter circuit 4. Instead of shifting the phase of the square wave signal U2, the phase of the sine-shaped AC voltage signal which is proportional to the impedance $Z_x$ is shifted such that the output signal U5 of the filter circuit 4 is in phase with the square wave signal U2, whereas the interfering frequencies are not shifted in such way. Thus at the input of the rectifier- and low-pass circuit 3 there are present a sine-shaped AC voltage signal and a square wave voltage signal in phase with each other like in the prior art lock-in amplifier of FIG. 1. The circuitry of FIG. 2, however, has various advantages as can be seen from the following embodiments of the invention.

The filter circuit 4 of FIG. 2 can be an all-pass circuit of first order, in the following called all-pass. The all-pass of first order passes AC signals of all frequencies without damping.

AC-signals having a frequency near the pole-frequency of the all-pass are phase shifted differently than all other AC signals. The phase shift at the pole frequency is $+90°$ or $-90°$.

As an oscillator an integrated circuit of the type 8038 (manufactured by Intersil or Exar) can be used, the sine-shaped AC voltage signal and the square wave signal of which are inphase quadrative. If there is no phase shift between the sine-shaped AC voltage signals U1 and U3 and if the frequency of the oscillator is equal to the pole frequency of the all-pass, the phase shift between the voltage signals U2 and U5 will be 0° or $\pm 180°$ depending on the all-pass used. The third harmonic which passed the prior art lock-in amplifier, however, is displaced inphase by 53.13° with respect to the fundamental wave. Therefore the contribution of said harmonic to the DC voltage $U_{DC}$ is reduced by the use of an all-pass of first order when compared with the prior art lock-in amplifier.

By appropriate choice of the filter circuit 4 of FIG. 2 this effect even can be enhanced, as will be explained below, by using a band-pass circuit of second order as a filter circuit 4. In contrast to the all-pass the phase frequency characteristic in the region of the pole frequency can have a much higher angle of inclination and the amplitude frequency characteristic results in an amplitude damping of undesired interference and harmonic waves in addition to the desired phase shift. In this embodiment the square wave signal U2 and the sine-shaped signal U1 must have synchronous zero passing if there is no phase shift in the measuring circuit 2.

The frequency of the oscillator then is equal to the pole frequency of the band-pass and the sine-shaped voltage U5 has a phase relation to the square wave signal U2 of 0° or $\pm 180°$ shift. The third harmonic then can be displaced in phase more than 53° with respect to the fundamental wave which is equal to the pole frequency of the band-pass depending on the band width and the quality of the band-pass. The additional phase shift (e.g. 80°) with respect to the fundamental wave alone results in a diminution of the influence of the harmonic on the DC voltage signal $U_{DC}$. The attenuation of the amplitude of the harmonic caused by the band-pass results in an additional improvement in comparison with the first embodiment and with the prior art lock-in amplifier.

The rectifier- and low-pass circuit according to the invention is designed such that by means of a switch an earth connected resistor can be short-circuited.

Figure 3:
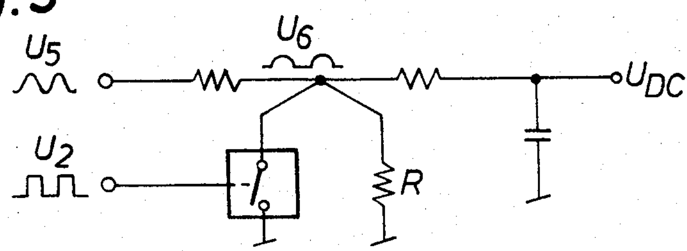
FIGS. 3 and 4 are embodiments of a rectifier- and low-pass circuits of the invention.

In FIG. 3 an embodiment of such a rectifier- and low-pass circuit 3 is shown. In contrast to a prior art lock-in amplifier wherein the sine-shaped voltage U3 by means of the square wave signal is switched on a capacitor, the resulting rectified signal being only thereafter transformed by means of a low-pass into the DC voltage $U_{DC}$; the present embodiment of the invention the DC voltage $U_{DC}$ is derived by intermittently short-circuiting an earth connected resistor R of a low-pass circuit of first order by means of a switch which is controlled by the square wave signal U2.

At the resistor then appears a half period U6 of the sine-shaped AC voltage U5. In the circuitry of FIG. 3 the charging of the capacitor is not switched abruptly and no disturbing voltage peaks are caused. The linearity of this circuitry has been found to be especially good for very low voltages (mV).

Figure 4:
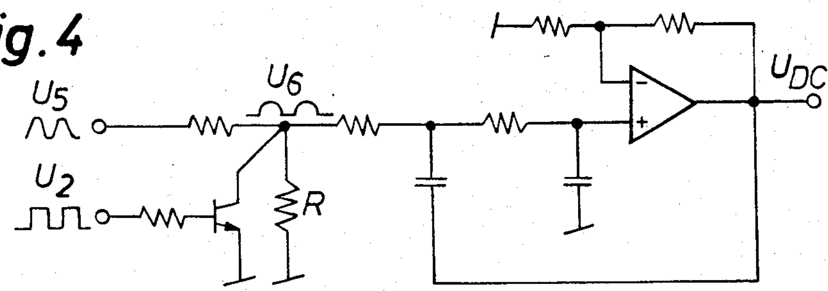

In FIG. 4 an improved embodiment of the rectifier- and low-pass circuit of FIG. 3 is shown. The switch is realized by a transistor and has the same functions as explained in connection with FIG. 3. In this circuitry an earth connected resistor R of a low-pass circuit of second order is short-circuited by means of the transistor. The use of a suitable circuit of second order has the advantage to reduce the transient time as well as the ripple factor of the DC voltage $U_{DC}$ in comparison with a circuit of first order.

Figure 5:
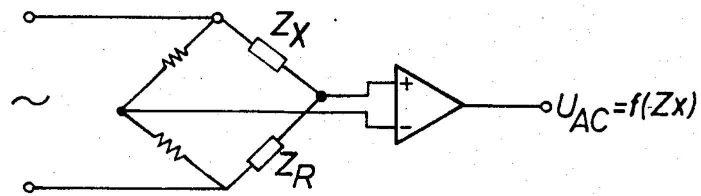
FIGS. 5 and 6 are embodiments of a measuring circuit for use in the invention.

In FIG. 5 an embodiment of the measuring circuit 2 (FIG. 2) is schematically illustrated, which can be used in the circuitry of the invention. As can be seen, it is a bridge circuit of known configuration; however, it should be understood that any modification of this bridge circuit could be used. Preferably, the impedance $Z_x$ to be measured is combined with a reference impedance ZR which is of the same type as $Z_x$. If e.g. $Z_x$ is a capacitor, the reference impedance ZR should also be a capacitor to avoid a phase shift in the measuring circuit 2.

Figure 6:
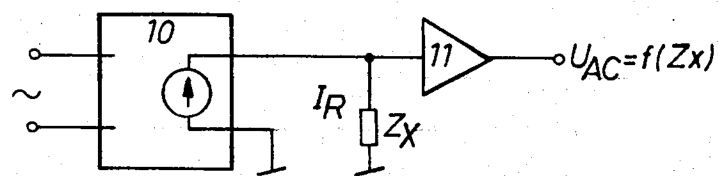

In FIG. 6 another embodiment of the measuring circuit 2 (FIG. 2) is schematically illustrated. Instead of a bridge circuit a voltage controlled current source 10 is used, such that a reference current IR passes the impedance $Z_x$ to be measured. By means of an impedance converter 11 the voltage over the impedance $Z_x$ is measured. At the output of the impedance converter an AC voltage signal $U_{AC}$ directly proportional to the impedance $Z_x$ appears and is supplied to the filter circuit 4 of FIG. 2.

Figure 7:
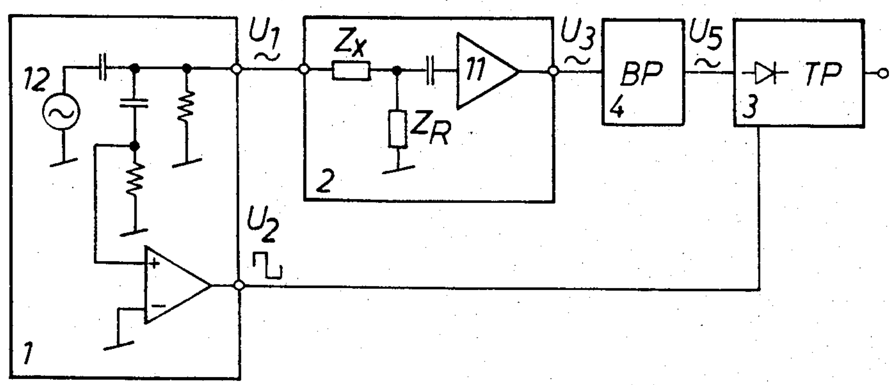
FIG. 7 is a block diagram of a circuitry of the invention for measuring an electrolytic impedance.

In FIG. 7 a block diagram of an embodiment of the invention for measuring an electrolytic impedance $Z_x$ is shown. In the oscillator circuit 1 a sinusoidal oscillator 12 is used, the output voltage of which is decoupled by a capacitor and transformed into a square wave voltage signal U2 by means of a comparator. At the output of the oscillator circuit 1 appear a plane harmonic AC voltage U1 without DC component and a square wave voltage U2 having a zero passing synchronous with the sine-shaped AC voltage U1.

In this embodiment special care is taken to prevent any DC current from flowing through the electrolytic impedances $Z_x$ and ZR. In the measuring circuit 2 the electrolytic impedance to be measured is combined with a reference impedance ZR to form a voltage divider.

The output of this voltage divider is connected by a capacitor to an impedance converter 11 for DC current decoupling. At the output of the impedance converter 11 (i.e. the output of the measuring circuit (2) the AC voltage U3 is proportional to the impedance $Z_x$ to be measured and contains harmonics and interfering frequencies.

The AC voltage U3 is supplied to a band-pass 4 of second order; the center frequency is equal to the frequency of the sinusoidal oscillator 12. At the output of the band-pass an AC voltage U5 is generated which has a phase relation to the square wave signal U2 of 0° or ±185° and which is supplied together with this square wave signal to the rectifier- and low-pass circuit 3 as shown in FIG. 4. This circuitry is especially suited for measuring the impedance of moisture sensitive electrolytic sensors.

While there are shown and described preferred embodiments of the invention, it is to be understood that the man skilled in the art may easily modify the circuitry by combining the above described elements in different ways. Of coruse, the use of the circuitry is not limited to electrolytic sensors, but the impedances of inductive and capacitive sensors as well as of those having an impedance with real and imaginary component can be measured.

What is claimed is:

1. Method of measuring the impedance of a sensor by a sine-shaped AC voltage of defined frequency comprising the steps of
   - generating a square wave voltage in synchronism with the sine-shaped AC voltage;
   - applying the sine-shaped AC voltage to a measuring circuit containing said impedance;
   - modifying the resulting AC voltage proportional to said impedance in a selective circuit of a defined phase-frequency- and amplitude-frequency characteristic, thereby bringing said AC voltage into a defined phase relation to said square wave voltage;
   - rectifying the modified AC voltage and transforming it into a DC voltage proportional to said impedance in a rectifier- and low-pass circuit, said rectifying and transforming step being affected by intermittently short-circuiting a grounded resistor of said rectifier- and low-pass circuit by means of a switch controlled by said square wave voltage.

2. Circuitry for carrying out the method defined in claim 1 comprising
   - an oscillator circuit (1) for generating a sine-shaped AC voltage and a square wave voltage in synchronism,
   - a measuring circuit (2) connected to the oscillator circuit and containing an impedance to be measured,
   - a rectifier- and low-pass circuit, and
   - a filter circuit connected between said rectifier- and low-pass circuit and said measuring circuit, said rectifier- and low-pass circuit being a low-pass circuit having a grounded resistor and a switch controlled by said square wave voltage for short-circuiting said grounded resistor.

3. Circuitry as defined in claim 2, wherein said measuring circuit comprises a bridge circuit and an impedance transformer.

4. Circuitry as defined in one of the preceding claims 2 and 3, wherein said measuring circuit comprises a voltage controlled current source (10) and an impedance transformer (11).

5. Circuitry as defined in claim 1, wherein said impedance to be measured is the resistance of an electrolytic solution.

6. Circuitry as defined in claim 5 for measuring humidity and water content.

7. Application of the method of claim 1 in the measurement of an electrolytic solution resistance.

8. Application as defined in claim 7 in the measurement of humidity and water content.

* * * * *